(12) United States Patent
Brown et al.

(10) Patent No.: US 9,896,587 B2
(45) Date of Patent: Feb. 20, 2018

(54) PLANARIZING AGENTS AND DEVICES

(71) Applicant: NISSAN CHEMICAL INDUSTRIES, LTD., Tokyo (JP)

(72) Inventors: Christopher T. Brown, Redwood City, CA (US); Venkataramanan Seshadri, Pittsburgh, PA (US)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 42 days.

(21) Appl. No.: 14/251,145

(22) Filed: Apr. 11, 2014

(65) Prior Publication Data
US 2014/0299858 A1 Oct. 9, 2014

Related U.S. Application Data

(63) Continuation of application No. 13/456,125, filed on Apr. 25, 2012, now Pat. No. 8,709,291, which is a
(Continued)

(51) Int. Cl.
*C09D 11/00* (2014.01)
*H01L 51/00* (2006.01)
(Continued)

(52) U.S. Cl.
CPC .............. *C09D 11/00* (2013.01); *C08L 65/00* (2013.01); *C09D 11/52* (2013.01); *C09D 129/02* (2013.01);
(Continued)

(58) Field of Classification Search
CPC ...... C09D 11/00; C09D 11/52; C09D 129/02; C09D 181/02; H01L 51/0025;
(Continued)

(56) References Cited

U.S. PATENT DOCUMENTS 4,356,429 A 10/1982 Tang
4,387,187 A 6/1983 Newton
(Continued)

FOREIGN PATENT DOCUMENTS

JP 2000-230040 8/2000
JP 2003-509816 A 3/2003
(Continued)

OTHER PUBLICATIONS

U.S. Appl. No. 61/032,905, filed Feb. 29, 2008, Seshadri et al.
(Continued)

*Primary Examiner* — Harold Pyon
*Assistant Examiner* — Danny N Kang
(74) *Attorney, Agent, or Firm* — The Marbury Law Group, PLLC

(57) ABSTRACT

Use of certain materials in hole injection layer and/or hole transport layer can improve operational lifetimes in organic devices. Polymers having fused aromatic side groups such as polyvinylnaphthol polymers can be used in conjunction with conjugated polymers. Inks can be formulated and cast as films in organic electronic devices including OLEDs, SMOLEDs, and PLEDs. One embodiment provides a composition comprising: at least one conjugated polymer, and at least one second polymer different from the conjugated polymer comprising at least one optionally substituted fused aromatic hydrocarbon side group. The substituent can be hydroxyl. Aqueous-based inks can be formulated.

17 Claims, 5 Drawing Sheets

Related U.S. Application Data continuation of application No. 12/395,327, filed on Feb. 27, 2009, now Pat. No. 8,187,501.

(60) Provisional application No. 61/032,905, filed on Feb. 29, 2008.

(51) Int. Cl.

| | |
|---|---|
| *C08L 65/00* | (2006.01) |
| *C09D 11/52* | (2014.01) |
| *H01B 1/12* | (2006.01) |
| *C09D 129/02* | (2006.01) |
| *C09D 181/02* | (2006.01) |
| *H01L 51/05* | (2006.01) |
| *H01L 51/42* | (2006.01) |
| *C08L 25/18* | (2006.01) |
| *H01L 51/50* | (2006.01) |

(52) U.S. Cl.
CPC ........... *C09D 181/02* (2013.01); *H01B 1/127* (2013.01); *H01L 51/0002* (2013.01); *H01L 51/0035* (2013.01); *H01L 51/0036* (2013.01); *H01L 51/0043* (2013.01); *H01L 51/05* (2013.01); *H01L 51/42* (2013.01); *H01L 51/5056* (2013.01); *H01L 51/5088* (2013.01); *C08G 2261/1424* (2013.01); *C08G 2261/212* (2013.01); *C08G 2261/3223* (2013.01); *C08G 2261/512* (2013.01); *C08G 2261/794* (2013.01); *C08L 25/18* (2013.01); *H01L 51/5048* (2013.01); *Y02E 10/549* (2013.01)

(58) Field of Classification Search
CPC ..... H01L 51/0043; H01L 51/05; H01L 51/42; H01L 51/5056; H01L 51/5088; H01L 51/0002; H01L 51/0036; H01L 51/5048; C08L 65/00; C08L 25/18; H01B 1/127; C08G 2261/1424; C08G 2261/212; C08G 2261/3223; C08G 2261/512; C08G 2261/794
USPC ................ 252/500; 254/40; 438/99, 46, 93; 524/502, 379
See application file for complete search history.

(56) References Cited

U.S. PATENT DOCUMENTS

| | | | |
|---|---|---|---|
| 4,415,706 A | 11/1983 | Staas | |
| 4,485,031 A | 11/1984 | Olstowski et al. | |
| 4,539,507 A | 9/1985 | Vanslyke et al. | |
| 4,737,557 A | 4/1988 | Sato et al. | |
| 4,898,912 A | 2/1990 | Siol et al. | |
| 4,909,959 A | 3/1990 | Lemaire et al. | |
| 4,929,388 A | 5/1990 | Wessling | |
| 4,935,164 A | 6/1990 | Wessling et al. | |
| 4,959,430 A | 9/1990 | Jonas et al. | |
| 4,990,557 A | 2/1991 | Lee | |
| 5,047,687 A | 9/1991 | Vanslyke | |
| 5,137,991 A | 8/1992 | Epstein et al. | |
| 5,160,457 A | 11/1992 | Elsenbaumer | |
| 5,225,495 A | 7/1993 | Han et al. | |
| 5,227,092 A | 7/1993 | Han | |
| 5,247,190 A | 9/1993 | Friend et al. | |
| 5,378,404 A * | 1/1995 | Han ...................... | H01B 1/128 252/500 |
| 5,401,827 A | 3/1995 | Holmes et al. | |
| 5,454,880 A | 10/1995 | Sariftci et al. | |
| 5,548,060 A | 8/1996 | Allcock et al. | |
| 5,968,675 A | 10/1999 | Tamano et al. | |
| 5,993,694 A | 11/1999 | Ito et al. | |
| 6,166,172 A | 12/2000 | McCullough et al. | |
| 6,361,886 B2 | 3/2002 | Shi et al. | |
| 6,365,294 B1 | 4/2002 | Pintauro et al. | |
| 6,602,974 B1 | 8/2003 | McCullough et al. | |
| 6,756,474 B2 * | 6/2004 | Hsu ................... | C08G 73/0266 252/500 |
| 6,812,399 B2 | 11/2004 | Shaheen et al. | |
| 6,933,436 B2 | 8/2005 | Shaheen et al. | |
| 7,332,107 B2 | 2/2008 | Takei et al. | |
| 7,402,342 B2 | 7/2008 | Jaycox et al. | |
| 7,569,159 B2 | 8/2009 | Hammond et al. | |
| 7,985,490 B2 | 7/2011 | Lee et al. | |
| 8,017,241 B2 | 9/2011 | Seshadri et al. | |
| 2005/0124784 A1 | 6/2005 | Sotzing | |
| 2005/0131185 A1 | 6/2005 | Jaycox et al. | |
| 2006/0057426 A1 | 3/2006 | Itoh | |
| 2006/0155106 A1 | 7/2006 | Roberts et al. | |
| 2006/0175582 A1 | 8/2006 | Hammond et al. | |
| 2007/0176163 A1 | 8/2007 | Drolet et al. | |
| 2008/0012430 A1 | 1/2008 | Peters et al. | |
| 2008/0248313 A1 | 10/2008 | Seshadri et al. | |
| 2010/0132782 A1 | 6/2010 | Laird et al. | |

FOREIGN PATENT DOCUMENTS

| | | |
|---|---|---|
| JP | 2005-521783 | 7/2005 |
| JP | 2006-076978 | 3/2006 |
| JP | 2006-225658 A | 8/2006 |
| JP | 2007-305505 | 11/2007 |
| JP | 2007-335696 | 12/2007 |
| WO | WO-01/18888 | 3/2001 |
| WO | WO-03/086026 A2 | 10/2003 |
| WO | WO-2004/072205 A2 | 8/2004 |
| WO | WO-2006/086480 A2 | 8/2006 |
| WO | WO-2006/101953 A2 | 9/2006 |

OTHER PUBLICATIONS

U.S. Appl. No. 61/034,476, filed Mar. 6, 2008, Seshadri et al.
U.S. Appl. No. 61/043,654, filed Apr. 9, 2008, Williams et al.
Anthopoulos et al., "Highly efficient single-layer dendrimer light-emitting diodes with balanced charge transport", Applied Physics Letters, vol. 82, No. 26, pp. 4824-4826 (2003).
Argun et al., "The first Truly All-Polymer Electrochromic Devices", Adv. Mater., (2003) 15, p. 1338-1341.
Bredas and Silbey (Eds.), Conjugated Polymers, (1991) Kluwer Acadamec Press, Dordrecht.
Francois et al., "Block-copolymers with conjugated segments: Synthesis and structural characterization", Synth. Met., vol. 69, pp. 463-466 (1995).
Friend, "Polymer LEDs," Physics World, vol. 5, No. 11, p. 42-46 (1992).
Hempenius et al., "A Polystyrene-Oligothiophene-Polystyrene Triblock Copolymer", J. Am. Chem. Soc., vol. 120, pp. 2798-2804 (1998).
Jenekhe et al., "Self-Assembled Aggregates of Rod-Coil Block Copolymers and their Solubilization and Encapsulation of Fullerenes", Science, vol. 279, pp. 1903-1907 (2008).
Katz et al., "Synthetic Chemistry for Ultrapure, Processable, and High-Mobility Organic Transistor Semiconductors", Accounts of Chemical Research, vol. 34, No. 5, pp. 359, 365-367 (2001).
Kraft et al., "Electroluminescent Conjugated Polymers-Seeing Polymers in a New Light," Agnew. Chem. Int. Ed., vol. 37, p. 402-428 (1998).
Lee et al., "Ring Sulfonated poly(thieno[3,4-b]thiophene)", Adv. Mater., vol. 17, pp. 1792-1795 (2005).
Lee et al., Flexible and transparent organic film speaker by using highly conducting PEDOT/PSS as electrode, Synth. Met., (2003) 139, 457-461.
Li (Ed.) , Organic Light-Emitting Materials and Devices, (2007) CRC.
Li et al., "Syntheses of Oligophenylenevinylenes-Polyisoprene Diblock Copolymers and Their Microphase Separation", Macromolecules, vol. 32, pp. 3034-3044 (1999).
March, Advanced Organic Chemistry, Reaction Mechanisms, and Structure, 6th Ed., (2007) Wiley.

(56) References Cited

OTHER PUBLICATIONS

McCullough et al., "Regioregular, Head-to-Tail Coupled Poly(3-alkylthiophene) and its Derivatives," Handbook of Conducing Polymers, 2nd Ed., (1998) Chapter 9, p. 225-258.

Friend et al., "Electroluminescence in Conjugated Polymers," Handbook of Conducing Polymers, 2nd Ed., (1998) Chapter 29, p. 823-846.

McCullough, "The Chemistry of Conducting Polythiophenes," Adv. Mater., (1998) 10, No. 2, p. 93-116.

Murov et al., Handbook of Photochemistry, 2nd Ed., (1993) Marcel Dekker.

Noshay and McGrath, Block Copolymers, Overview and Critical Survey, (1997) Academic Press.

Notice of Reasons for Rejection with English translation for JP Appln. No. 2010-548920 dated Sep. 26, 2012, 8 pages.

PCT/US2009/035565 filed Feb. 27, 2009, Intl. Search Report & Written Opinion dated Jul. 30, 2009 (13 pages).

Roncali, "Conjugated Poly(thiophenes): Synthesis, Functionalization, and Applications", Chem. Rev., (1992) vol. 92, pp. 711-738 (1992).

Schopf et al., Polythiophenes: Electrically Conductive Polymers, (1997) Springer: Berlin.

Sun and Sariciftci, Organic Photovoltaics, Mechanisms, Materials, and Devices, (2005) CRC.

Wang et al., "Syntheses of Amphiphilic Diblock Copolymers Containing a Conjugated Block and Their Self-Assembling Properties", J. Am. Chem. Soc., vol. 122, 6855-6861 (2000).

Widawski et al., "Self-organized honeycomb morphology of star-polymer polystyrene films", Nature (London), vol. 369, pp. 387-389 (1994).

Wiley, The Encyclopedia of Polymer Science and Engineering, (1990) p. 298-300.

Yang et al., "A Soluble Blue-Light-Emitting Polymer", Macromolecules, vol. 26, pp. 1188-1190 (1993).

Zhang et al., "Polymer photovoltaic cells with conducting polymer anodes", Adv. Mater., (2002) 14, p. 662-665.

\* cited by examiner

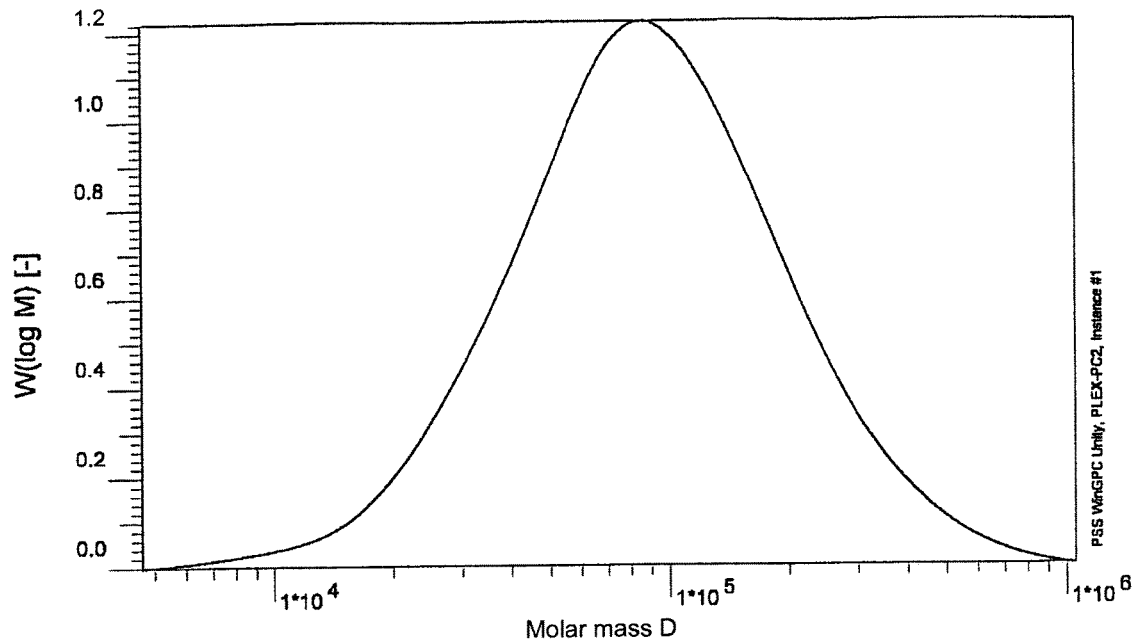

| Sample: | VS-04-081(0.5) | | |
|---|---|---|---|
| Integration from: | Friday 02/22/08 12:47:02 | | 18.102 ml |
| Integration to: | Friday 02/22/08 12:54:00 | | 25.065 ml |
| Calibration File: | PSty-toluene-January-30-08.CAL | Eluent: | CHCl3 |
| MHK – A (Cal.): | 0.000E+0 | MHK – K (Cal.): | 1.000E+0 ml/g |
| Int. stand.-cal.: | 33.560 ml | Int.stand.-sam.: | ------ml |
| Pump | Waters 515 HPLC | Flowrate: | 1.000 ml/min |
| Concentration: | 1.000 g/l | Inject volume: | 100.000 ul |
| Column 1: | PSS 5u 100 Å | Temperature: | 0.000 C |
| Column 2: | PSS 5u 100 Å | Temperature: | 0.000 C |
| Column 3: | PSS 5u 100,000 Å | Temperature: | 0.000 C |
| Column 4: | PSS Guard | Temperature: | 0.000 C |
| Detector 1: | Waters 2414 Ri | Delay volume: | 0.000 ml |
| Operator: | Plex PC2 | Acquisition interval | 1.000 sec |

Waters 2414 Ri

| $\overline{M_n}$ : | 6.3339e4 | g/mol |
|---|---|---|
| $\overline{M_w}$ : | 1.1762e5 | g/mol |
| $\overline{M_z}$ : | 2.0732e5 | g/mol |
| $\overline{M_v}$ : | 0.000000 | g/mol |
| D : | 1.8570e0 | |
| [n]: | 0.000000 | ml/g |
| Vp : | 2.0933e1 | ml |
| Mp : | 8.9948e4 | g/mol |
| A : | 3.7963e0 | ml*V |
| < 4650 | 0.00 | |
| W% : | 100.00 | |
| > 1051670 | 0.00 | |

Figure 3

PLANARIZING AGENTS AND DEVICES

RELATED APPLICATIONS

This application claims priority to U.S. provisional application Ser. No. 61/032,905 filed Feb. 29, 2008, which is hereby incorporated by reference in its entirety.

BACKGROUND

Although useful advances are being made in energy saving devices such as organic-based organic light emitting diodes (OLEDs), polymer light emitting diodes (PLEDs), and organic photovoltaic devices (OPVs), further improvements are still needed in providing better processing and performance. For example, one promising type of material is the conducting polymer including, for example, polythiophenes and regioregular polythiophenes. However, problems can arise with doping, purity, solubility, and/or processing. In particular, it is important to have very good control over the solubility of alternating layers of polymer (e.g., orthogonal or alternating solubility properties among adjacent layers). In particular, hole injection layers and hole transport layers can present difficult problems in view of competing demands and the need for very thin, but high quality, films.

A need exists for a good platform system to control properties of hole injection and transport layers such as solubility and electronic energy levels such as HOMO and LUMO, so that the materials can be adapted for different applications and to function with different materials such as light emitting layers, photoactive layers, and electrodes. In particular, good solubility properties are important, as well as the control of energy levels such as HOMO and LUMO, and the ability to formulate the system for a particular application and provide the required balance of properties.

SUMMARY

Embodiments described herein can include, for example, compositions, including solid and liquid compositions, methods of making and using the compositions, and devices and articles. Compositions can include, for example, polymers, monomers, blends, films, dispersions, solutions, and ink formulations. Copolymers can be block, random, segmented, and the like. Polymers can be lightly or more highly branched. Polymers can be crosslinked.

One embodiment provides a composition comprising: at least one conjugated polymer, and at least one second polymer different from the conjugated polymer comprising at least one optionally substituted fused aromatic hydrocarbon side group.

The fused aromatic hydrocarbon side group can be substituted with a polar group.

The fused aromatic hydrocarbon side group can be substituted with hydroxyl.

The fused aromatic hydrocarbon side group can be substituted with a sulfonic acid group or salt thereof.

The fused aromatic hydrocarbon side group can be substituted with a sulfonic acid, a perfluoroalkylsulfonic acid, a perfluoroalkylethersulfonic acid, glycol ether, alkylsulfonic acid, or combination thereof.

The fused aromatic hydrocarbon side group can be substituted with an amino or thiol group.

The fused aromatic hydrocarbon side group can be a naphthalene group.

The second polymer can comprise a carbon backbone and the optionally substituted fused aromatic hydrocarbon side group can comprise two fused benzene rings.

The second polymer can provide a decreased singlet and/or triplet excited state energy.

The second polymer can be an excited state stabilizer.

The second polymer can have a number average molecular weight between about 5,000 and about 100,000 g/mol.

The first and second polymers can be at least partially soluble or dispersible in water.

The conjugated polymer can be a heterocyclic polymer.

The conjugated polymer can comprise a polythiophene backbone.

The conjugated polymer can comprise a sulfonated polythiophene.

The conjugated polymer can be self-doped.

The conjugated polymer can comprise regioregular polythiophene.

The conjugated polymer can comprise regioregular polythiophene, wherein the degree of regioregularity is greater than about 75% regioregular.

The conjugated polymer can comprise derivatized polythiophene, wherein the derivative comprises at least one etheric side group.

The conjugated polymer can be a sulfonated poly(3-(methoxyethoxyethoxy)thiophene-2,5-diyl) and the second polymer can be poly-2-vinylnaphthol.

The conjugated polymer and the amount of the second polymer can be adapted for use of the composition as a hole injection layer or a hole transport layer in an electronic device.

The composition can comprise between about 1 wt. % and 30 wt. % of the conjugated polymer and between about 70 wt. % and 99 wt. % of the second polymer.

The composition can comprise between about 10 wt. % and 20 wt. % of the conjugated polymer and between about 80 wt. % and 90 wt. % of the second polymer.

The composition can further comprise a dopant.

The composition can further comprise a dopant, wherein the dopant is an anionic polymer.

The composition can further comprise at least one carrier solvent.

The composition can further comprise at least one carrier solvent wherein water is the solvent present in the most amount.

The first and second polymers can be soluble polymers, the first polymer can be a sulfonated polythiophene, and the second polymer can be a poly (vinyl naphtha).

The first and second polymers can be soluble polymers, the first polymer can be a sulfonated polythiophene comprising ether substituents, and the second polymer can be a poly (vinyl naphtha).

The first and second polymers can be soluble polymers, the first polymer can be a sulfonated regioregular polythiophene comprising ether substituent's, and the second polymer can comprise at least one repeat unit represented by:

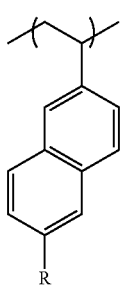

Wherein R can be a polar functional group, and wherein the amount of the conjugated polymer and the amount of the second polymer can be adapted for use of the composition as a hole injection layer or a hole transport layer in an electronic device.

Another embodiment provides a composition comprising: at least one conjugated polymer, and at least one second polymer comprising at least one repeat unit represented by:

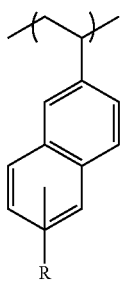

The repeat unit can be represented by:

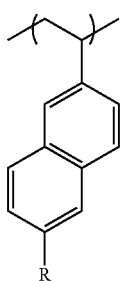

The repeat unit can be represented by:

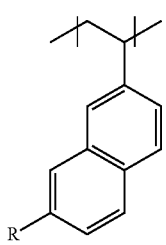

The R group can be a hydroxyl group.

The R group can comprise a sulfonic acid group or salt thereof.

The R group can comprise sulfonic acid, a perfluoroalkylsulfonic acid, a perfluoroalkylethersulfonic acid, glycol ether, alkylsulfonic acid, or combination thereof.

The R group can be substituted with an amino or thiol group.

The second polymer can provide a decreased singlet and/or triplet excited state energy.

The second polymer can be an excited state stabilizer.

The second polymer can have a number average molecular weight between about 10,000 and about 100,000 g/mol.

The first and second polymers can be at least partially soluble or dispersible in water.

The conjugated polymer can be a heterocyclic polymer.

The conjugated polymer can comprise a polythiophene backbone.

The conjugated polymer can comprise a sulfonated polythiophene.

The conjugated polymer can be self-doped.

The conjugated polymer can comprise regioregular polythiophene.

The conjugated polymer can comprise regioregular polythiophene, wherein the degree of regioregularity is greater than about 75% regioregular.

The conjugated polymer can comprise derivatized polythiophene, wherein the derivative comprises at least one etheric side group.

The conjugated polymer can be sulfonated poly(3-(methoxyethoxyethoxy)thiophene-2,5-diyl) and the second polymer can be poly-2-vinylnaphthol.

The amount of the conjugated polymer and the amount of the second polymer can be adapted for use of the composition as a hole injection layer or a hole transport layer in an electronic device.

The composition can comprise between about 1 wt. % and 30 wt. % of the conjugated polymer and between about 70 wt. % and 99 wt. % of the second polymer.

The composition can comprise between about 10 wt. % and 20 wt. % of the conjugated polymer and between about 80 wt. % and 90 wt. % of the second polymer.

The composition can further comprise a dopant.

The composition can further comprise a dopant, wherein the dopant is an anionic polymer.

The composition can further comprise at least one carrier solvent.

The composition can further comprise at least one carrier solvent wherein water is the solvent present in the most amount.

The first and second polymers can be soluble polymers, the first polymer can be a sulfonated polythiophene, and the second polymer can be a poly(vinyl naphthol).

The first and second polymers can be soluble polymers, the first polymer can be a sulfonated polythiophene comprising ether substituents, and the second polymer can be a poly(vinyl naphthol).

The repeat unit can be the only repeat unit in the second polymer.

Another embodiment provides a composition comprising: at least one conjugated polymer, and at least one second polymer that provides a decreased singlet or triplet excited state.

The second polymer can comprise repeat units represented by:

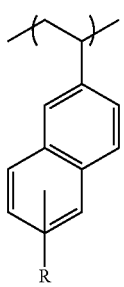

The second polymer can comprise repeat units represented by:

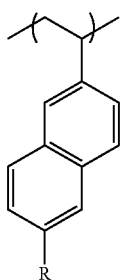

The second polymer can comprise repeat units represented by:

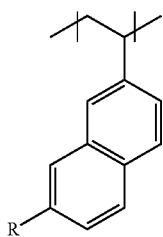

The composition can reduce a system energy for material located at a light emissive polymer interface.

The R group can be a polar group.

The R group can be a hydroxyl group.

The R group can comprise a sulfonic acid group or salt thereof.

The R group can comprise sulfonic acid, a perfluoroalkylsulfonic acid, a perfluoroalkylethersulfonic acid, glycol ether, alkylsulfonic acid, or combination thereof.

The R group can be substituted with an amino or thiol group.

The first and second polymers can be at least partially soluble or dispersible in water.

The conjugated polymer can be a heterocyclic polymer.

The conjugated polymer can comprise a polythiophene backbone.

The conjugated polymer can comprise a sulfonated polythiophene.

The conjugated polymer can be self-doped.

The conjugated polymer can comprise regioregular polythiophene.

The conjugated polymer can comprise regioregular polythiophene, wherein the degree of regioregularity can be greater than about 75% regioregular.

The conjugated polymer can comprise derivatized polythiophene, wherein the derivative comprises at least one etheric side group.

The conjugated polymer can be sulfonated poly(3-(methoxyethoxyethoxy)thiophene-2,5-diyl) and the second polymer can be poly-2-vinylnaphthol.

The amount of the conjugated polymer and the amount of the second polymer can be adapted for use of the composition as a hole injection layer or a hole transport layer in an electronic device.

Another embodiment provides a composition comprising: at least one conjugated polymer, at least one second polymer different from the conjugated polymer comprising at least one optionally substituted fused aromatic hydrocarbon side group, a solvent carrier for the conjugated polymer and the second polymer, wherein the composition is formulated for use as a hole injection or hole transport layer in an organic device.

The solvent carrier can comprise at least two solvents.

The solvent carrier can comprise at least two solvents, and the solvent present in largest weight percent can be water.

The amount of the conjugated polymer and the amount of the second polymer can be adapted for use of the composition as a hole injection layer or a hole transport layer in an electronic device.

The composition can comprise between about 1 wt. % and 30 wt. % of the conjugated polymer and between about 70 wt. % and 99 wt. % of the second polymer with respect to total solid content.

The composition can comprise between about 10 wt. % and 20 wt. % of the conjugated polymer and between about 80 wt. % and 90 wt. % of the second polymer with respect to total solid content.

The percent solids can be about 1 wt. % to about 10 wt. %.

The percent solids can be about 1 wt. % to about 5 wt. %.

The fused aromatic hydrocarbon side group can be substituted with a polar group.

The fused aromatic hydrocarbon side group can be substituted with hydroxyl.

Another embodiment provides a device comprising a layer comprising the compositions as described herein. For example, in one embodiment, the layer is a hole injection layer or a hole transport layer. In various embodiments, the device is an OLED device, or the device is a photovoltaic device, or the device is an ESD device, or the device comprises at least two electrodes and at least one light emitting or photovoltaic active layer. In additional embodiments, the device can be a sensor, a supercapacitor, a cation transducer, a drug release device, an electrochromic device, a transistor, a field effect transistor, an electrode modifier, an electrode modifier for an organic field transistor, an actuator, or a transparent electrode. The composition can be a coating on an electrode.

Another embodiment provides a method of making a device comprising: providing a substrate; layering a transparent conductor on the substrate; providing a composition comprising at least one conducting polymer comprising conjugated units, and at least one polymer comprising fused aromatic hydrocarbon side groups; layering the composition on the transparent conductor to form a hole injection layer or hole transport layer; layering an active layer on the hole injection layer or hole transport layer; and layering a cathode on the active layer.

Another embodiment provides a method comprising: applying the compositions as described herein as part of an HIL or HTL layer in an OLED, a photovoltaic device, an ESD, a SMOLED, a PLED, a sensor, a supercapacitor, a cation transducer, a drug release device, an electrochromic device, a transistor, a field effect transistor, an electrode modifier, an electrode modifier for an organic field transistor, an actuator, or a transparent electrode.

At least one advantage from at least one embodiment described herein includes improvements in operational stability including long term stability of an organic electronic device such as for example an OLED or OPV device. In particular, improvements can be realized compared to use of poly-4-vinylphenol and PEDOT/PSS controls. In particular, voltage and luminance properties can be improved. Unexpectedly, in some embodiments, the composition of the hole transport layer and/or hole injection layer can be used to improve long term stability.

At least one additional advantage for at least one embodiment includes much more flexibility in formulation.

Other advantages can relate to advantages of hole injection layers including, for example, better planarization and/or control of the electric field in the layer.

BRIEF DESCRIPTION OF DRAWINGS

FIG. 3 provides GPC analysis for Example 2 polymer (P2VNOTiPS).

DETAILED DESCRIPTION

Introduction/Conducting and Conjugated Polymers

Figure 1:
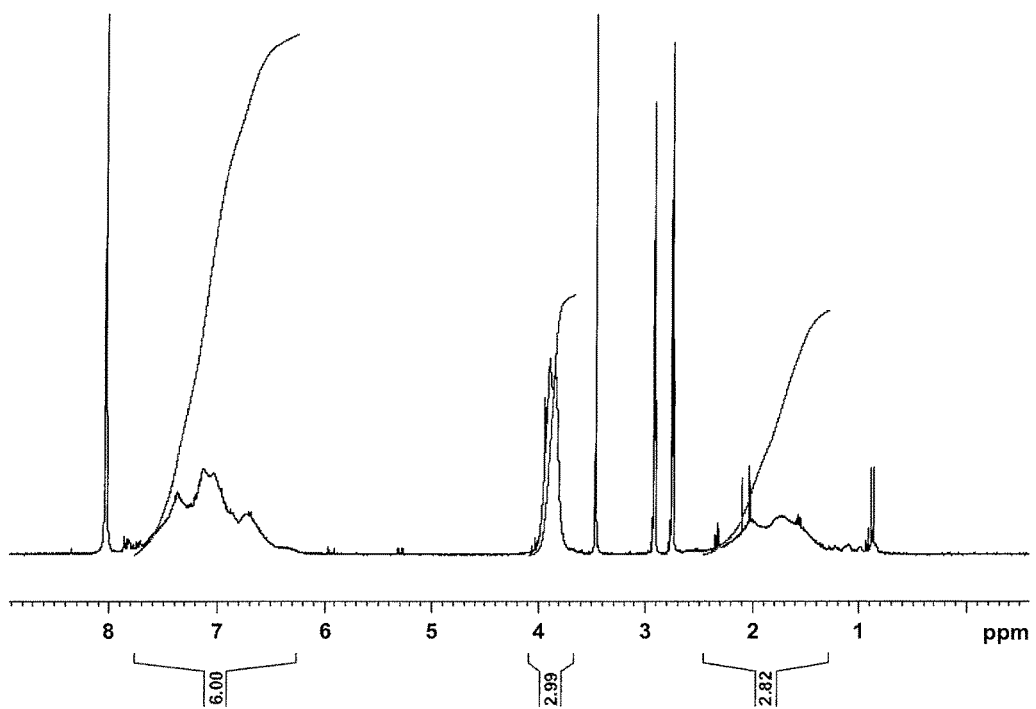
FIG. 1 provides $^1$H NMR data for Example 2 polymer.

All references cited herein are incorporated by reference in their entirety.

Priority U.S. provisional application Ser. No. 61/032,905 filed Feb. 29, 2008 is hereby incorporated by reference in its entirety.

The first polymer can be a conjugated polymer. Polymers are known in the art including their use in organic electronic devices. See, for example, Friend, "Polymer LEDs," *Physics World*, November 1992, 5, 11, 42-46.

Conjugated polymers are also known in the art. See, for example, Kraft et al., "Electroluminescent Conjugated Polymers-Seeing Polymers in a New Light," *Angew. Chem. Int. Ed.* 1998, 37, 402-428.

Electrically conductive or conjugated polymers are described in *The Encyclopedia of Polymer Science and Engineering*, Wiley, 1990, pages 298-300, including polyacetylene, poly(p-phenylene), poly(p-phenylene sulfide), polypyrrole, and polythiophene, which is hereby incorporated by reference in its entirety. This reference also describes blending and copolymerization of polymers, including block copolymer formation.

Conjugated polymer including polythiophenes can be homopolymers, copolymers, or block copolymers. Synthetic methods, doping, and polymer characterization, including regioregular polythiophenes with side groups, is provided in, for example, U.S. Pat. No. 6,602,974 to McCullough et al. and U.S. Pat. No. 6,166,172 to McCullough et al., which are hereby incorporated by reference in their entirety. Additional description can be found in the article, "The Chemistry of Conducting Polythiophenes," by Richard D. McCullough, *Adv. Mater.* 1998, 10, No. 2, pages 93-116, and references cited therein, which is hereby incorporated by reference in its entirety. Another reference which one skilled in the art can use is the *Handbook of Conducting Polymers, 2$^{nd}$ Ed.* 1998, Chapter 9, by McCullough et al., "Regioregular, Head-to-Tail Coupled Poly(3-alkylthiophene) and its Derivatives," pages 225-258, which is hereby incorporated by reference in its entirety. This reference also describes, in chapter 29, "Electroluminescence in Conjugated Polymers" at pages 823-846, which is hereby incorporated by reference in its entirety.

Polythiophenes are described, for example, in Roncali, J., *Chem. Rev.* 1992, 92, 711; Schopf et al., *Polythiophenes: Electrically Conductive Polymers*, Springer: Berlin, 1997. See also for example U.S. Pat. Nos. 4,737,557 and 4,909,959.

Polymeric semiconductors are described in, for example, "Organic Transistor Semiconductors" by Katz et al., *Accounts of Chemical Research*, vol. 34, no. 5, 2001, page 359 including pages 365-367, which is hereby incorporated by reference in its entirety.

Block copolymers are described in, for example, *Block Copolymers, Overview and Critical Survey*, by Noshay and McGrath, Academic Press, 1977. For example, this text describes A-B diblock copolymers (chapter 5), A-B-A triblock copolymers (chapter 6), and -(AB)$_n$— multiblock copolymers (chapter 7), which can form the basis of block copolymer types in the present invention.

Additional block copolymers including polythiophenes are described in, for example, Francois et al., *Synth. Met.* 1995, 69, 463-466, which is incorporated by reference in its entirety; Yang et al., *Macromolecules* 1993, 26, 1188-1190; Widawski et al., *Nature (London)*, vol. 369, Jun. 2, 1994, 387-389; Jenekhe et al., *Science*, 279, Mar. 20, 1998, 1903-1907; Wang et al., *J. Am. Chem. Soc.* 2000, 122, 6855-6861; Li et al., *Macromolecules* 1999, 32, 3034-3044; Hempenius et al., *J. Am. Chem. Soc.* 1998, 120, 2798-2804;

The following article describes several types of regioregular systems beginning at page 97 and references cited therein: "The Chemistry of Conducting Polythiophenes," by Richard D. McCullough, *Adv. Mater.* 1998, 10, No. 2, pages 93-116. In a regioregular polymer, including a polythiophene, the degree of regioregularity can be, for example, about 90% or more, or about 95% or more, or about 98% or more, or about 99% or more. Methods known in the art such as, for example, NMR can be used to measure the degree of regioregularity. In one embodiment, the degree of regioregularity is greater than about 75%. In another embodiment, the degree of regioregularity is between about 85% and 99%, or between about 85% and about 95%.

Regioregularity can arise in multiple ways. For example, it can arise from polymerization of asymmetric monomers such as a 3-alkylthiophene to provide head-to-tail (HT) poly(3-substituted)thiophene. Alternatively, it can arise from polymerization of monomers which have a plane of symmetry between two portions of monomer such as for example a bi-thiophene, providing for example regioregular HH-TT and TT-HH poly(3-substituted thiophenes).

In particular, substituents which can be used to solubilize conducting polymers with side chains include alkoxy and alkyl including for example C1 to C25 groups, as well as heteroatom systems which include for example oxygen and nitrogen. In particular, substituents having at least three carbon atoms, or at least five carbon atoms can be used. Mixed substituents can be used. The substituents can be nonpolar, polar or functional organic substitutents. The side group can be called a substituent R which can be for example alkyl, perhaloalkyl, vinyl, acetylenic, alkoxy, aryloxy, vinyloxy, thioalkyl, thioaryl, ketyl, thioketyl, and optionally can be substituted with atoms other than hydrogen.

Thiophene polymers can be star shaped polymers with the number of branches being for example more than three and comprising thiophene units. Thiophene polymers can be dendrimers. See for example Anthopoulos et al., *Applied Physics Letters*, 82, 26, Jun. 30, 2003, 4824-4826, and further description of dendrimers hereinafter.

Heterocyclic polymers are particularly preferred. A particularly preferred system is the polythiophene system and the regioregular polythiophene system. Polymers can be obtained from Plextronics, Inc., Pittsburgh, Pa. including for example polythiophene-based polymers such as for example Plexcore, Plexcoat, and similar materials.

Another embodiment includes heterocyclic conjugated polymers which are relatively regioirregular. For example, the degree of regioregularity can be about 90% or less, or about 80% or less, or about 70% or less, or about 60% or less, or about 50% or less.

An example of a first polymer is a water soluble polymer, including a sulfonated polymer.

Conjugated polymer can be doped as known in the art. For example, organic or inorganic dopants can be used. Polymeric dopant and anionic polymer dopants can be used such as polystyrene sulfonate. The polymer can be self-doping.

Sulfonation of Conducting Polymers and Polythiophenes

One important example of a conjugated polymer, and formulations and devices using the polymer, is a sulfonated conjugated polymer including a sulfonated polythiophene and a sulfonated regioregular polythiophene. See for example U.S. patent application Ser. No. 11/826,394 filed Jul. 13, 2007 to Seshadri et al. (US patent publication 2008/0248313) which is hereby incorporated by reference in its entirety, including figures, working examples, and claims.

When a regioregular polymer is subjected to sulfonation, the polymer composition can be yet called regioregular for present purposes. Sulfonation is generally known in the art, wherein there is an introduction into an organic molecule of the sulfonic acid group or its salts, —$SO_3H$, wherein the sulfur atom is bonded to carbon of the organic molecule. Examples in the patent literature include for example U.S. Pat. No. 5,548,060 to Allcock et al.; U.S. Pat. No. 6,365,294 to Pintauro et al.; U.S. Pat. No. 5,137,991 to Epstein et al.; and U.S. Pat. No. 5,993,694 to Ito et al. Additional sulfonation methods are described in for example (1) Sotzing, G. A. Substituted thieno[3,4-b]thiophene polymers, method of making and use thereof, US 2005/0124784 A1; (2) Lee, B.; Seshadri, V.; Sotzing, G. A. Ring Sulfonated poly(thieno[3,4-b]thiophene), *Adv. Mater.* 2005, 17, 1792.

The sulfonated substituent can be in various forms. For example, the sulfonated substituent can be in acid form; or the sulfonated substituent can be in salt form comprising a counterion; or the sulfonated substituent can be in salt form comprising a counterion, wherein the counterion comprises organic groups; or the sulfonated substituent can be in salt form comprising a counterion, wherein the counterion comprises an organic cation including for example alkyl groups and is free of metal; or the sulfonated substituent is in salt form comprising a counterion, wherein the counterion comprises a metal cation. The degree of sulfonation can be controlled to for example about 5% to about 95%, or about 10% to about 90%, or to about 25% to about 75%. As sulfonation progresses, the sulfonated polythiophene is solubilized and/or dispersed in a strong acid. The direct bonding of the sulfonate sulfur atom to the polythiophene can allow for adjustments of band gap structure.

Second Polymer/Fused Aromatic Hydrocarbon Side Groups

The second polymer is different from the first polymer. The second polymer can comprise at least one repeat unit comprising side groups comprising, optionally substituted, fused aromatic rings or, optionally substituted, polycyclic aromatic hydrocarbon side groups. These side groups can be free of non-carbon atoms in the fused aromatic structure. The fused aromatic ring side group can be selected and substituted so that the polymer has suitable solubility and other useful properties for a particular application. The fused aromatic ring structures can comprise two or more aromatic rings. The second polymer can be a synthetic polymer. The second polymer can be a water soluble polymer or organic soluble polymer. Additionally, the second polymer can be a homopolymer, copolymer, including a block copolymer, or a mixed-substituent polymer.

Fused aromatic rings systems are known in the art including for example chemical compounds used as substituents such as for example naphthene, anthracene, chrysene, corannulene, phenanthrene, and triphenylene. The numbering systems for these fused aromatic compounds are known in the art. See for example March's *Advanced Organic Chemistry, Reaction Mechanisms, and Structure*, 6$^{th}$ Ed. Wiley, 2007.

The molecular weight of the polymer, including molecular weight distribution, can be adapted for an application and formulation strategy. The molecular weight of the second polymer typically can be for example between about 5,000 g/mol to about 100,000 g/mol, or about 10,000 g/mol and 100,000 g/mol, or between about 1,700 g/mol and 85,000 g/mol. More typically, the molecular weight of the second polymer can be between about 5,100 g/mol and 34,000 g/mol. Even more typically, the molecular weight of the second polymer can be between about 8,500 and 17,000 g/mol.

The optionally substituted fused aromatic rings or optionally substituted polycyclic aromatic hydrocarbon side groups can comprise at least one substituent such as a polar functional group as substituent. More than one substituent can be present, and different types of substituents can be present. The polar functional group can be any appropriate polar group. A hydroxyl functional group is a preferred functional group. Alternatively, the polar functional group can be an amino group or a thiol group. In another embodiment, the polar functional group can be a group comprising at least one sulfonic acid group, including salts thereof, including for example sulfonic acid, perfluoroalkylsulfonic acid, perfluoroalkylether sulfonic acid, alkyl sulfonic acid, and salts thereof. Another example is a glycol ether group. Additional examples include, for example, optionally substituted alkyl, optionally substituted aryl, polyether, alkoxy, perfluoropolyether, perfluoropolyether sulfonic acid and its salts, and arylamine.

The molar amount of repeat units having a group comprising sulfonic acid, or salt thereof, can be for example 10% to 60%, or 20% to 50%, or 30% to 45%.

The optionally substituted fused aromatic or optionally substituted polycyclic aromatic hydrocarbon side groups can comprise a non-polar functional group as substituent. The non-polar group can be adapted for a particular application and formulation, but examples include an alkyl or perfluoroalkyl group, including C1 to C24 groups, or C1 to C12 groups.

Other examples of substituents include for example heterocyclic or polycyclic aromatic moiety.

In a preferred embodiment, the second polymer is a polyvinylnaphthol. In a more preferred embodiment, the second polymer comprises poly-2-vinyl-6-naphthol.

In an alternative embodiment, the second polymer is water soluble and is in salt form comprising a counterion, wherein the counterion comprises organic groups. Alternatively, the second polymer is water soluble and is in salt form comprising a counterion, wherein the counterion comprises an organic cation and is free of metal.

Preferably, the second polymer is an excited state stabilizer. In another embodiment, an extended aromatic π system of the second polymer offers a decreased singlet excited state energy. In another embodiment, an extended aromatic π system of the second polymer offers a decreased triplet excited state energy. Benzene has a singlet excited state energy of >3 eV while naphthalene is <3 eV. In adapting the side group and polymer structures, one can in many cases move from high energy band gap to low energy band gap molecules to increase lifetime. One can use calculations to examine excited states, or one can make quantitative assessments using optical, photochemical, and electrochemical measurements to characterize the ground and excited state properties of the material. For context, see for example S. Murov et al, *Handbook of Photochemistry*, $2^{nd}$ Ed., Marcel Dekker, 1993; Turro, *Modern Molecular Photochemistry*, University Science, 1991.

The second polymer can be a vinyl polymer and can comprise a carbon backbone with a single optionally substituted fused aromatic side group such as a naphthyl group as side group. If the naphthyl group is substituted, it can be substituted at any position on the naphthyl that can be substituted. In some cases, substitution at the six position is preferred. Isomeric substitution patterns including the substitution for the polymer backbone can be for example 2,7; or 1,4; or 1,5, and the like.

A repeat unit for the second polymer can be represented by:

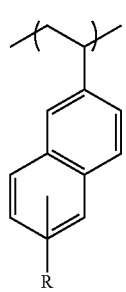

Formula I wherein R can be an optional substituent on any suitable position on the naphthyl group. In one embodiment, formula I is the only repeat unit, or it can comprise at least 90 molar % of the polymer repeat units.

In some embodiments, the second polymer can comprise the structure (formula II):

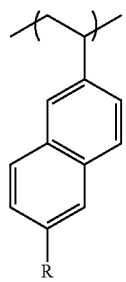

Formula II where R is an optional substituent at the 6-position. In some embodiments, —R is a polar functional group. —R can be any appropriate polar functional group. In one embodiment, —R is an amino functional group. In an alternative embodiment, —R is a thiol functional group. In a particularly preferred embodiment, —R is a hydroxyl functional group or a protected hydroxyl group. In a preferred embodiment, the second polymer is a polyvinylnaphthol. In a more preferred embodiment, the second polymer comprises poly-2-vinyl-6-naphthol.

In other embodiments, the second polymer can comprise the structure (formula II):

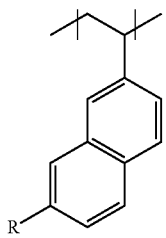

Formula III where R is an optional substituent. In some embodiments, —R is a polar functional group. —R can be any appropriate polar functional group. In one embodiment, —R is an amino functional group. In an alternative embodiment, —R is a thiol functional group. In a particularly preferred embodiment, —R is a hydroxyl functional group, or a protected hydroxyl group. In a preferred embodiment, the second polymer is a polyvinylnaphthol. In a more preferred embodiment, the second polymer comprises poly-2-vinyl-7-naphthol.

In formulas I and II and III, additional repeat units can be present. For example, if a polymer is modified so that its side groups react to form the structures of formula I, II, or III, the reaction may not go to completion and unreacted side groups may be present as a second repeat unit.

The fused aromatic side groups can be, for example, non-amine side groups and can be free of aromatic-nitrogen linkages and free of nitrogen.

The fused aromatic side groups can be derivatized as known in the art so that, for example, an —OH group is converted to an —OR group. See, for example, U.S. Provisional Application 61/034,476 filed Mar. 6, 2008 for modification of planarizing agents.

Synthesis and Polymerization of Monomers for Second Polymer

Monomers can be prepared by organic synthetic methods known in the art including methods exemplified in the working examples below. For example, protecting groups can be used. After the monomer is polymerized, the polymer can be modified subsequent to polymerization. In some cases, improved yields can be achieved by using higher percent solids in the polymerization.

Formulations/Inks

One skilled in the art can blend the first and second polymers using one or more solvents or dispersing aids as an ink carrier or a solvent system. This can form an ink. In particular, water can be used. One or more organic solvents may be also used. The concentration of solids in the ink can be adapted for an application. For example, viscosity can be controlled. The solids concentration can be for example about 0.1 wt. % to about 25 wt. %, or about 0.5 wt. % to about 10 wt. %, or about 1 wt. % to about 10 wt. %, or about 1 wt. % to about 5 wt. %.

The conducting polymer and polythiophene compositions, which can be sulfonated as described above, can be formulated and blended by methods known in the art to formulators including, for example, varying the amounts of the components, varying combinations of different structural types, use of different mixing conditions, using different solvents, applying different film preparation conditions, using different purification methods, and the like. Formulations for specific applications in hole injection technology are particularly important. One or more first polymers can be used. One or more second polymers can be used.

Typical solvents that can be used include water and organic solvents including organic solvents with at least some miscibility with water. Solvent mixtures can be used. Examples include cellosolves, carbitols, lower alcohols such as for example a C1, C2 or C3 alcohol, and a ketone such as for example a C3 to C5 ketone.

Compatible mixtures of polymers can be formulated. The blend can be compatible when it is not characterized by excessive phase separation and forms functionally useful, mechanically stable films which can function as a hole injection layer. Compatible blends are known in the art. See, for example, U.S. Pat. Nos. 4,387,187; 4,415,706; 4,485,031; 4,898,912; 4,929,388; 4,935,164; and 4,990,557. Compatible blends do not have to be miscible blends, but are sufficiently mixed and stable to provide useful function, particularly in thin film form such as, for example, about 2 nm to about 100 nm. Blending methods may include solution blending of a predissolved conducting polymer either in neutral or oxidized form disintegrated into nanosized particles (typically from tens to hundreds of nanometers) with conventional polymers (e.g., polystyrene (PS), poly(methyl methacrylate) (PMMA), poly(vinyl acetate) (PVA)) by sonicating, agitation, or shear. Such blends provide fine dispersion of film-forming submicronic particles of stable polymer matrix solutions. Films can be prepared and analyzed for compatibility by spin coating.

Inks can be applied by methods known in the art like ink jet printing and spin coating solution casting.

See also, for example, U.S. patent application Ser. No. 11/826,394 filed Jul. 13, 2007 to Seshadri et al. which is hereby incorporated by reference in its entirety, including figures, working examples, and claims.

Examples of ink formulation for HIL and HTL applications include, for example, U.S. patent application Ser. No. 11/350,271 filed Feb. 9, 2006.

Amounts

In one embodiment, the composition comprises between about 1 wt. % and about 99 wt. % of the conjugated polymer and between about 1 wt. % and about 99 wt. % of the second polymer. In another embodiment, the composition comprises between about 1 wt. % and about 50 wt. % of the conjugated polymer and between about 50 wt. % and about 99 wt. % of the second polymer. In another embodiment, composition comprises between about 1 wt. % and about 30 wt. % of the conjugated polymer and between about 70 wt. % and about 99 wt. % of the second polymer. In another embodiment, composition comprises between about 10 wt. % and about 30 wt. % of the conjugated polymer and between about 70 wt. % and about 90 wt. % of the second polymer. In another embodiment, composition comprises between about 5 wt. % and about 20 wt. % of the conjugated polymer and between about 80 wt. % and about 95 wt. % of the second polymer. Typically, the composition comprises more of the second polymer than of the conjugated polymer.

Devices

Various devices can be fabricated in many cases using multilayered structures which can be prepared by, for example, solution or vacuum processing, as well as printing and patterning processes. In particular, use of the embodiments described herein for hole injection layers (HILs) can be carried out effectively. In particular, applications include hole injection layer for OLEDs, PLEDs, SMOLEDs, ESDs, photovoltaic cells, supercapacitors, cation transducers, drug release, electrochromics, sensors, FETs, actuators, and membranes. Another application is as an electrode modifier including an electrode modifier for an organic field effect transistor (OFETS). Other applications include those in the field of printed electronics, printed electronics devices, and roll-to-roll production processes.

For example, photovoltaic devices are known in the art. The devices can comprise, for example, multi-layer structures including for example an anode, including a transparent conductor such as indium tin oxide (ITO) on glass or PET; a hole injection layer and/or a hole transport layer; a P/N bulk heterojunction layer; a conditioning layer such as LiF; and a cathode such as for example Ca, Al, or Ba. Devices can be adapted to allow for current density versus voltage measurements.

Similarly, OLED devices are known in the art. The devices can comprise, for example, multi-layer structures including for example an anode, including a transparent conductor such as ITO on glass or PET or PEN; a hole injection layer; an electroluminescent layer such as a polymer layer; a conditioning layer such as LiF, and a cathode such as for example Ca, Al, or Ba.

Methods known in the art can be used to fabricate devices including for example OLED and OPV devices. Methods known in the art can be used to measure brightness, efficiency, and lifetimes. OLED patents include for example U.S. Pat. Nos. 4,356,429 and 4,539,507 (Kodak). Conducting polymers which emit light are described in for example U.S. Pat. Nos. 5,247,190 and 5,401,827 (Cambridge Display Technologies). See also Kraft et al., "Electroluminescent Conjugated Polymers—Seeing Polymers in a New Light," Angew. Chem. Int. Ed., 1998, 37, 402-428, including device architecture, physical principles, solution processing, multilayering, blends, and materials synthesis and formulation, which is hereby incorporated by reference in its entirety.

Light emitters known in the art and commercially available can be used including various conducting polymers as well as organic molecules, such as materials available from Sumation, Merck Yellow, Merck Blue, American Dye Sources (ADS), Kodak (e.g, AlQ3 and the like), and even Aldrich such as BEHP-PPV. Examples of such organic electroluminescent materials include:

(i) poly(p-phenylene vinylene) and its derivatives substituted at various positions on the phenylene moiety;

(ii) poly(p-phenylene vinylene) and its derivatives substituted at various positions on the vinylene moiety;

(iii) poly(p-phenylene vinylene) and its derivatives substituted at various positions on the phenylene moiety and also substituted at various positions on the vinylene moiety;

(iv) poly(arylene vinylene), where the arylene may be such moieties as naphthalene, anthracene, furylene, thienylene, oxadiazole, and the like;

(v) derivatives of poly(arylene vinylene), where the arylene may be as in (iv) above, and additionally have substituents at various positions on the arylene;

(vi) derivatives of poly(arylene vinylene), where the arylene may be as in (iv) above, and additionally have substituents at various positions on the vinylene;

(vii) derivatives of poly(arylene vinylene), where the arylene may be as in (iv) above, and additionally have substituents at various positions on the arylene and substituents at various positions on the vinylene;

(viii) co-polymers of arylene vinylene oligomers, such as those in (iv), (v), (vi), and (vii) with non-conjugated oligomers; and (ix) polyp-phenylene and its derivatives substituted at various positions on the phenylene moiety, including ladder polymer derivatives such as poly(9,9-dialkyl fluorene) and the like;

(x) poly(arylenes) where the arylene may be such moieties as naphthalene, anthracene, furylene, thienylene, oxadiazole, and the like; and their derivatives substituted at various positions on the arylene moiety;

(xi) co-polymers of oligoarylenes such as those in (x) with non-conjugated oligomers;

(xii) polyquinoline and its derivatives;

(xiii) co-polymers of polyquinoline with p-phenylene substituted on the phenylene with, for example, alkyl or alkoxy groups to provide solubility; and (xiv) rigid rod polymers such as poly(p-phenylene-2,6-benzobisthiazole), poly(p-phenylene-2,6-benzobisoxazole), polyp-phenylene-2,6-benzimidazole), and their derivatives.

(xv) polyfluorene polymers and co-polymers with polyfluorene units

Preferred organic emissive polymers include SUMATION Light Emitting Polymers ("LEPs") that emit green, red, blue, or white light or their families, copolymers, derivatives, or mixtures thereof; the SUMATION LEPs are available from Sumation KK. Other polymers include polyspirofluorene-like polymers available from Covion Organic Semiconductors GmbH, Frankfurt, Germany (now owned by Merck®).

Alternatively, rather than polymers, small organic molecules that emit by fluorescence or by phosphorescence can serve as the organic electroluminescent layer. Examples of small-molecule organic electroluminescent materials include: (i) tris(8-hydroxyquinolinato)aluminum (Alq); (ii) 1,3-bis(N,N-dimethylaminophenyl)-1,3,4-oxidazole (OXD-8); (iii) -oxo-bis(2-methyl-8-quinolinato)aluminum; (iv) bis(2-methyl-8-hydroxyquinolinato) aluminum; (v) bis(hydroxybenzoquinolinato) beryllium (BeQ.sub.2); (vi) bis(diphenylvinyl)biphenylene (DPVBI); and (vii) arylamine-substituted distyrylarylene (DSA amine).

Such polymer and small-molecule materials are well known in the art and are described in, for example, U.S. Pat. No. 5,047,687 issued to VanSlyke; and Bredas, J.-L., Silbey, R., eds., Conjugated Polymers, Kluwer Academic Press, Dordrecht (1991).

Examples of HIL in devices include:
1) Hole injection in OLEDs including PLEDs and SMOLEDs; for example, for HIL in PLED, all classes of conjugated polymeric emitters where the conjugation involves carbon or silicon atoms can be used. For HIL in SMOLED, the following are examples: SMOLED containing fluorescent emitters; SMOLED containing phosphorescent emitters; SMOLEDs comprising one or more organic layers in addition to the HIL layer; and SMOLEDs where the small molecule layer is processed from solution or aerosol spray or any other processing methodology. In addition, other examples include HIL in dendrimer or oligomeric organic semiconductor based OLEDs; HIL in ambipolar light emitting FET's where the HIL is used to modify charge injection or as an electrode;

2) Hole extraction layer in OPV; see, for example, U.S. patent application 61/043,654 filed Apr. 9, 2008;

3) Channel material in transistors

4) Channel material in circuits comprising a combination of transistors such as logic gates 5) Electrode material in transistors 6) Gate layer in a capacitor 7) Chemical sensor where modification of doping level is achieved due to association of the species to be sensed with the conductive polymer.

A variety of photoactive layers can be used in OPV devices. Photovoltaic devices can be prepared with photoactive layers comprising fullerene derivatives mixed with for example conducting polymers as described in for example U.S. Pat. No. 5,454,880 (Univ. Cal.); U.S. Pat. No. 6,812,399; and U.S. Pat. No. 6,933,436. Also, photoactive layers may comprise blends of conducting polymers, blends of conducting polymers and semiconducting nanoparticles, and bilayers of small molecules such as pthalocyanines, fullerenes, and porphyrins.

Common electrode materials and substrates, as well as encapsulating materials can be used.

OLED Measurements

OLED devices are known in the art. See, for example, *Organic Light-Emitting Materials and Devices*, (Ed. Li, Meng), CRC, 2007, and references cited therein. Methods known in the art can be used to measure OLED parameters. For example, measurements can be carried out at 10 mA/cm$^2$.

Voltage can be for example from about 2 to about 15, or about 2 to about 8, or from about 3 to about 14, or from about 3 to about 7 including for example about from 2 to about 5.

Brightness can be, for example, at least 250 cd/m$^2$, or at least 500 cd/m$^2$, or at least 750 cd/m$^2$, or at least 1,000 cd/m$^2$.

Efficiency can be, for example, at least 0.25 cd/A, or at least 0.45 cd/A, or at least 0.60 cd/A, or at least 0.70 cd/A, or at least 1.00 cd/A, or at least 2.5 cd/A, or at least 5.00 cd/A, or at least 7.50 cd/A, or at least 10.00 cd/A, or at least 20 cd/A, or at least 30 cd/A, or at least 60 cd/A, or at least 80 cd/A. An upper limit can be for example about 200 cd/A.

Lifetime can be measured at 50 mA/cm$^2$ or up to 75 mA/cm$^2$ in hours and can be, for example, at least 50 hours, or at least 100 hours, or at least about 900 hours, or at least 1,000 hours, or at least 1100 hours, or at least 2,000 hours, or at least 5,000 hours, or at least 10,000 h, or at least 20,000 h, or at least 50,000 h.

Combinations of brightness, efficiency, and lifetime can be achieved. For example, brightness can be at least 1,000 cd/m2, efficiency can be at least 1.00 cd/A, and lifetime can be at least 1,000 hours, at least 2,500 hours, or at least 5,000 hours.

OPV Measurements

OPV devices are known in the art. See, for example, *Organic Photovoltaics, Mechanisms, Materials, and Devices*, Sun and Sariciftci, CRC, 2005. Methods known in the art can be used to measure OPV parameters.

$J_{SC}$ values (mA/cm$^2$) can be for example at least 6, or at least 7, or at least 8, or at least 9, or at least 10, or at least 11, or at least 12. The values can be for example about 5 to about 12, or about 5 to about 15, or about 5 to about 20.

$V_{OC}$ values (V) can be for example at least about 0.5, or at least about 0.6, or at least about 0.7, or at least about 0.8, or at least about 0.9, or at least about 1.0, or at least about 2.0, including for example about 0.5 to about 2.0, or about 0.5 to about 1.0, or about 0.55 to about 0.65.

FF values can for example at least about 0.2, or at least about 0.3, or at least about 0.4, or at least about 0.5, or at least about 0.6, or at least about 0.7, including also for example about 0.5 to about 0.8, or about 0.5 to about 0.73.

E (%) values can be for example at least about 1%, or at least about 2%, or at least about 3%, or at least about 4%, or at least about 5%, or at least about 6%, or at least about 7%, including for example about 1% to about 8%, or about 1% to about 7%, or about 1% to about 6%, or about 1% to about 5%, or about 1% to about 3.4%, or about 2% to about 3.4%.

Polymers and formulations thereof as described herein can be made into an ink that can be used to produce high-performance hole-extraction layer for organic photovoltaic devices. HIL layers can conduct holes and mediate hole-extraction as well as current incumbent materials.

Control materials can be formulated such as PEDOT materials described in U.S. Pat. No. 4,959,430 to Jonas et al. Baytron materials can be obtained from H. C. Stark. Carbazole compounds are described in for example WO 2004/072205 to Brunner et al.

Other types of devices which interact with light and or electricity/electric fields can be fabricated including sensors and transistors including field effect transistors (e.g., as electrodes or as active channel material, e.g., for use in logic circuits and other electronic circuitry). In particular, pH sensors, or sensors which are sensitive to detection of compounds which have functionalities which can bind to acid can be made and used in for example an optical sensing tool. Other device applications include for example supercapacitors (e.g., light weight power sources functioning as storage media with good charge capacity), cation transducers (e.g., devices featuring a cation binding event causing an optical or electrical signal), drug release (e.g., drugs with ionic functionalities can be bound to the polymer and a redox chemistry can trigger the release of the drug into the body; or an embedded microchip with the polymer can help trigger the release of the drug into the body by changing the doping profile), electrochromics, actuators (e.g., electrochemical doping/de-doping also can change the volume of the polymer which is the basis for actuating mechanism. Applications based on this can involve artificial muscles activated by electrical pulse, or also smart membranes with tunable pore size for purification of solvents), transparent electrodes to replace for example ITO, and membranes.

OPV devices and active layers materials are described in, for example, U.S. patent application Ser. No. 11/743,587 filed May 2, 2007, including use of fullerene derivatives and fullerene-indene compounds in the active layer.

Applications

Additional description for applications is provided:

For electrochromical applications and devices, including mirrors, see for example Argun et al., *Adv. Mater.* 2003, 15, 1338-1341 (all polymeric electrochromic devices). For example, the sulfonated polymer exhibits very good stability in the oxidized form (i.e., very clear in the visible region). Mirrors with good stability in the clear state can be made. Only when a car with intense head-lamps approaches will the mirrors will be activated to become dark. If the polymer can return to its oxidized form by itself it can be very advantageous as it will require no power to return its normal state. Since it absorbs strongly, through the NIR (which is the heating radiation) windows coated with this polymer can potentially keep rooms cooler at the same time allowing light to penetrate into the building, spacecrafts etc., potentially minimizing the load on the ACs and lights.

For sensors, change in conductivity, charge transport properties, and/or optical properties can be made to occur due to specific interactions of material to be sensed with the HIL formulation; the signal can be detected in sensors.

For photovoltaics, see for example Zhang et al. (polymer photovoltaic cells with conducting polymer anodes) *Adv. Mater.* 2002, 14, 662-665.

For speakers: see for example Lee, et al. (Flexible and transparent organic film speaker by using highly conducting PEDOT/PSS as electrode), *Synth. Met.* 2003, 139, 457-461.

WORKING EXAMPLES

Further description is also provided by way of the following non-limiting working examples.

Example 1: Synthesis of Monomers 25 g of 6-bromo-2-naphthol and 250 ml of dry diethyl ether was added to a clean, dry 500 ml round bottom flask. This solution was cooled in an ice-water bath for 15 minutes under a nitrogen blanket. 3.11 g of 95% sodium hydride (NaH) was added to the flask all at once. The resulting solution was yellow and bubbled. Once the solution ceased bubbling, after about two hours, 27.82 mL triisopropylsilyl chloride (TIPSCl) was added via syringe. The reaction was warmed to room temperature over 1 hour. TLC (hexanes: SiO$_2$) indicated reaction was complete. Reaction was worked up by pouring into 100 ml of 0.25 M Na$_2$CO$_3$ with vigorous stirring and subsequently extracting with hexanes (2×200 ml). The combined organic phases were washed with 100 ml of 10% NH$_4$Cl followed by 100 ml of water and then dried over magnesium sulfate. This solution was filtered and concentrated to yield brown oil which was fractionally distilled at 210° C./~1 torr to give a light yellow, thick, viscous oil. NMR and GC/MS were consistent with (6-Bromo-naphthalen-2-yloxy)-triisopropyl-silane. This reaction is illustrated as:

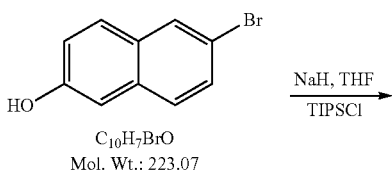

-continued

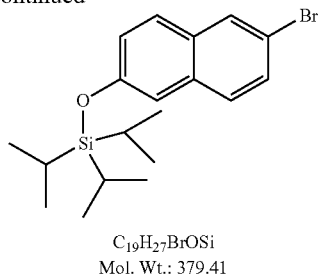

C$_{19}$H$_{27}$BrOSi
Mol. Wt.: 379.41

To a clean, flame-dried 250 ml round bottom flask was added 7 g of (6-Bromo-naphthalen-2-yloxy)-triisopropyl-silane. 100 ml anhydrous ether from Mbraun solvent dispenser was transferred via cannulae to the flask. The flask was cooled for 20 minutes to −78° C. in a dry-ice/acetone bath. To the cooled flask was added 21.9 ml tert-butyl lithium from a 1.7 M stock pentane solution (Aldrich Chemicals) over a period of approximately 5 minutes. The reaction mixture immediately turned brown-yellow and was allowed to stir for 1 hour. The mixture was allowed to warm to 0° C., forming a thick, white solid. The reaction was cooled again to −78° C. at which time 14.3 ml of anhydrous DMF was added quickly by syringe. The mixture was stirred overnight while allowing to slowly warm to room temperature. The resulting thick white solution was poured into 500 ml of 3% HCl with vigorous stirring. This was extracted with 500 ml of ethylacetate. The organic phase was washed with 100 ml of 0.25 M Na$_2$CO$_3$, followed by 100 ml of 10% NH$_4$Cl, and finally 100 ml of distilled water. The organic phase was dried over MgSO$_4$, filtered and concentrated to yield a yellow oil. This was purified on silica gel with hexanes:ethylacetate as eluent. Proton NMR and GC/MS were consistent with 6-triisopropylsilanyloxy-naphthalene-2-carbaldehyde. This reaction is illustrated as:

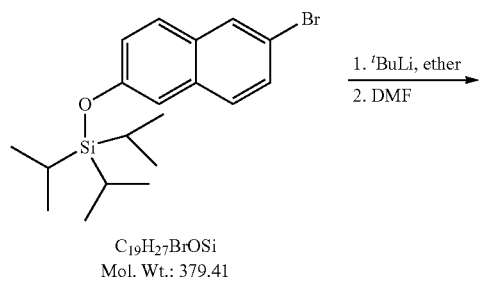

C$_{19}$H$_{27}$BrOSi
Mol. Wt.: 379.41

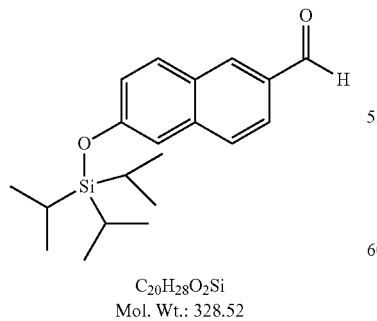

C$_{20}$H$_{28}$O$_2$Si
Mol. Wt.: 328.52

A first and second solution were prepared. For the first solution, a clean and dry 100 ml round bottom flask was charged with 4.68 g (0.014 moles) of 6-triisopropylsilany-loxy-naphthalene-2-carbaldehyde and 50 ml of anhydrous THF under a nitrogen atmosphere. The first solution was transferred to an addition funnel by cannulae.

For the second solution, 2.71 g of potassium tert-butoxide in a glove box was charged to a flame-dried 250 ml round bottom flask. 100 ml anhydrous tetrahydrofuran was added by cannulae under a nitrogen atmosphere to the flask. Methyltriphenylphosphonium bromide was then added all at once as a solid. The solution immediately turned yellow with formation of solids.

The second solution was added dropwise to the first solution over a fifteen minute period. Approximately five minutes after addition of aldehyde was completed a TLC (Hexanes:SiO$_2$) indicated there was a quantitative conversion to product. The reaction was worked up by pouring into 500 ml of 3% HCl with vigorous stirring. This was extracted with 500 ml of ethylacetate. The organic phase was washed with 100 ml of 0.25 M Na$_2$CO$_3$, followed by 100 ml of 10% NH$_4$Cl, and finally 100 ml of distilled water. The organic phase was dried over MgSO$_4$, filtered and concentrated to yield a brown oil. This was purified on silica gel with hexanes as eluent. NMR and GC/MS were consistent with triisopropyl-(6-vinyl-naphthalen-2-yloxy)-silane. This reaction is illustrated as:

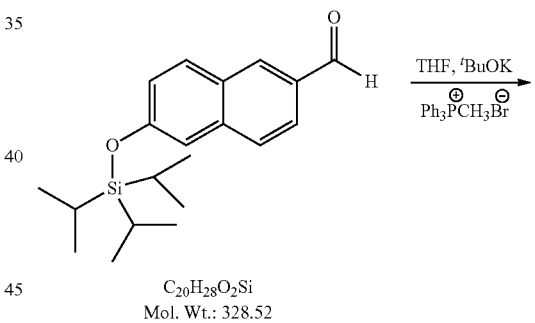

C$_{20}$H$_{28}$O$_2$Si
Mol. Wt.: 328.52

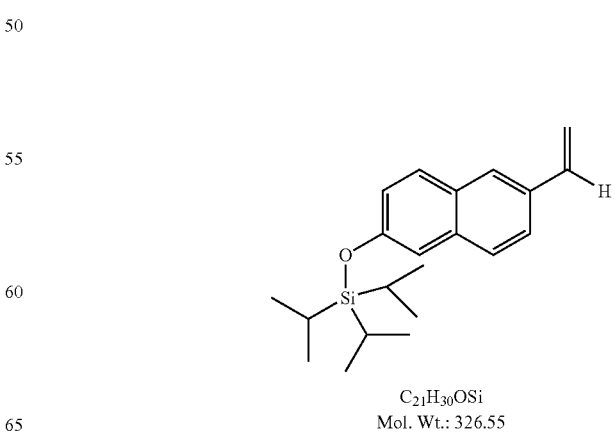

C$_{21}$H$_{30}$OSi
Mol. Wt.: 326.55

Example 2: Polymerization of Monomers and Post-Polymerization Modification

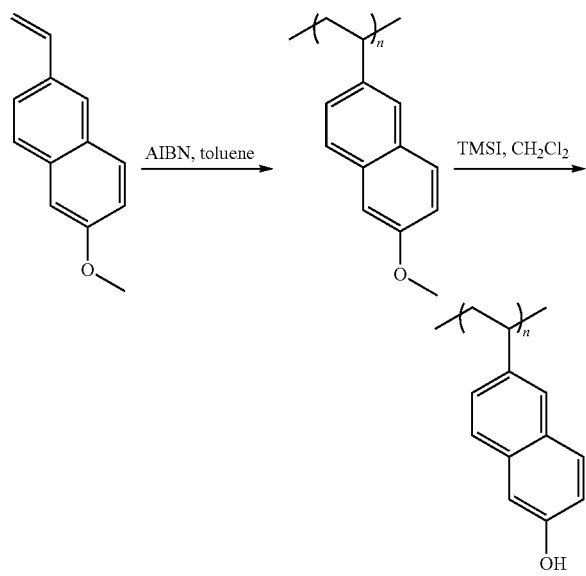

Synthesis of poly(2-methoxy-6-vinylnaphthalene)

To a flame dried and nitrogen purged 250 mL 2NRBF added 10.0 g 2-methoxy-6-vinylnaphthalene and 89 mg AIBN in the glove-box. Sealed the flask with rubber septa and injected 90 mL anhydrous toluene from MBraun solvent dispenser obtained in a flame dried Schlenck flask. Purged the solution with nitrogen for 1 h. Heated the reaction mixture to 105° C. for 24 h, cooled and precipitated into 1 L ethanol with vigorous stirring. Filtered the precipitated polymer, washed with ethanol and dried in vacuo at room temperature. Obtained 2.7 g (27% yield). The polymer was taken for hydrolysis step without further purification. $^1$H-NMR (FIG. 1) (CDCl$_3$, δ ppm): Aryl H's 6-7.7 (br, 6H), CH$_3$O— 3.7-4.0 (br, 3H), CH$_2$=CH— 1.2-2.3 (br, 3H)

Silanolysis of poly(2-methoxy-6-vinylnaphthalene) (P2VNOH)

Figure 2:
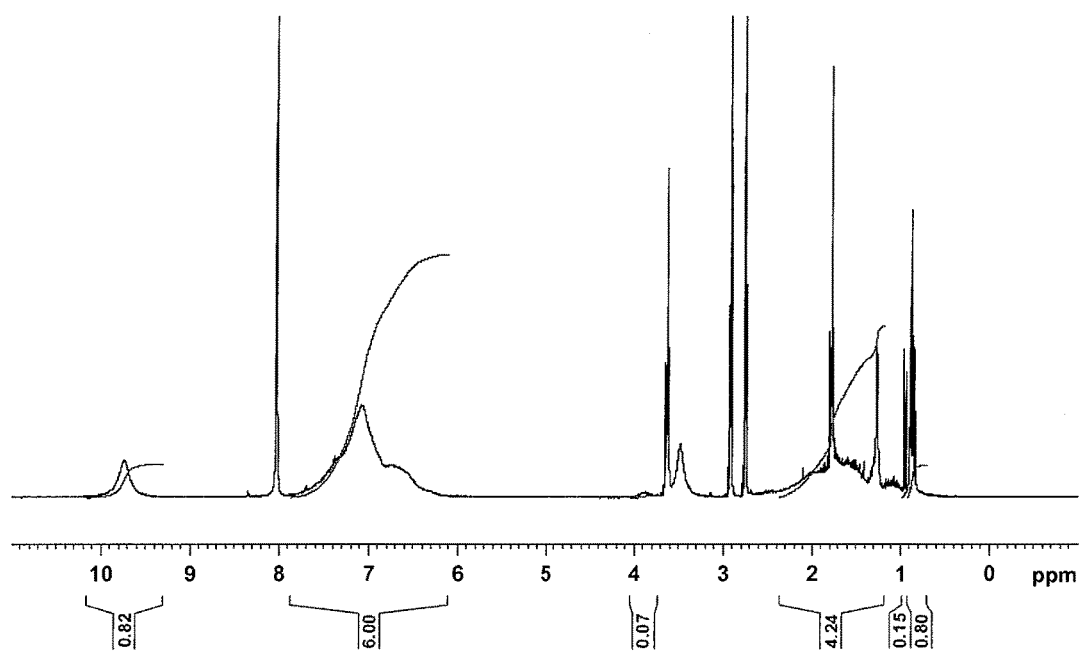
FIG. 2 provides $^1$H NMR data for Example 2 polymer (P2VNOH).

About 2.5 g of poly(2-methoxy-6-vinylnaphthalene) was dissolved in 25 mL dichloromethane in a 100 mL flame dried 2NRBF. To this solution added 2.0 g of trimethylsilyl iodide and stirred the solution at RT for 1 week under nitrogen atmosphere, removing samples intermittently after 72 and 120 h for % hydrolysis. After 1 week the conversion was 90% complete based on ratio of aryl H's and residual CH$_3$—O peaks. Transferred to a rotary evaporator under nitrogen and stripped all the solvent. Added about 20 mL ethanol to dissolve polymer and then precipitated by adding the solution to 200 mL 0.5 N hydrochloric acid. Stirred the mixture for 30 min and filtered the polymer. Dissolved the polymer again in 50 mL ethanol, added 10 mL concentrated hydrochloric acid and stirred at RT for 1 h. Precipitated the polymer in 600 mL de-ionized water, washed with de-ionized water. The polymer was stirred in a solution of 1.0 g sodium thiosulfate dissolved in 100 mL de-ionized water for 1 h at RT and filtered, washed with de-ionized water. The polymer was dried in vacuo at RT for 4 days. Following this the polymer was dissolved in 20 mL THF, filtered through 0.45 μm PVDF syringe filters and precipitated into 300 mL hexanes. Polymer was further washed with hexanes and suction dried on Buchner funnel followed by drying on high vacuum at RT for 24 hrs. $^1$H-NMR (FIG. 2) (DMF-d$_7$, δ ppm): OH— 9.6-10.0 (br, 1H), Aryl H's 6-7.8 (br, 6H), CH$_2$=CH— 1.2-2.3 (br, 3H).

Synthesis of poly(2-triisopropylsilyloxy-6-vinylnaphthalene) (P2VNOTiPS)

Figure 4:
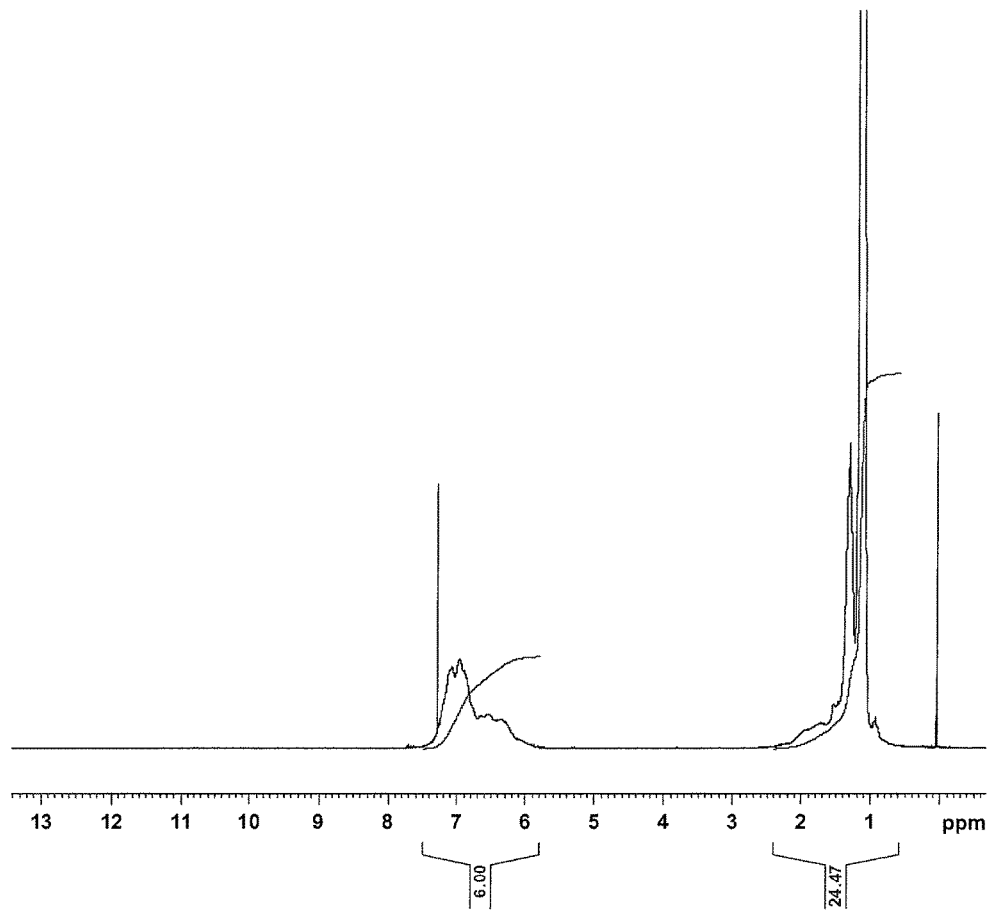
FIG. 4 provides $^1$H NMR data for Example 2 polymer (P2VNOTiPS).

To a clean dry 250 mL 2 NRBF added 10.025 g of the monomer 2-vinyl-6-triisopropylsilyloxynaphthalene, 16 mL anhydrous toluene and 20.5 mg AIBN (doubly recyrstallized from methanol). The solution was purged with Nitrogen for 40 min and then heated to 60° C. for 12 h and then at 100° C. for an additional 8 h. After cooling the solution to room temperature diluted solution with about 30 mL toluene and precipitated into 60 mL ethanol. Filtered the precipitated white polymer and washed with ethanol. Obtained 8.5 g (84.7%) after drying. Molecular weight was obtained using GPC (FIG. 3) with chloroform as eluent and a UV-vis detector (λ=254 nm). Mn=63339; DPI=2.07. Polymer was taken for hydrolysis without further purification. $^1$H-NMR (FIG. 4) (CDCl$_3$, δ ppm): Aryl H's 6-7.4 (br, 6H), i-Pr$_3$SiO— and CH$_2$=CH— 0.8-2.3 (br, 24H)

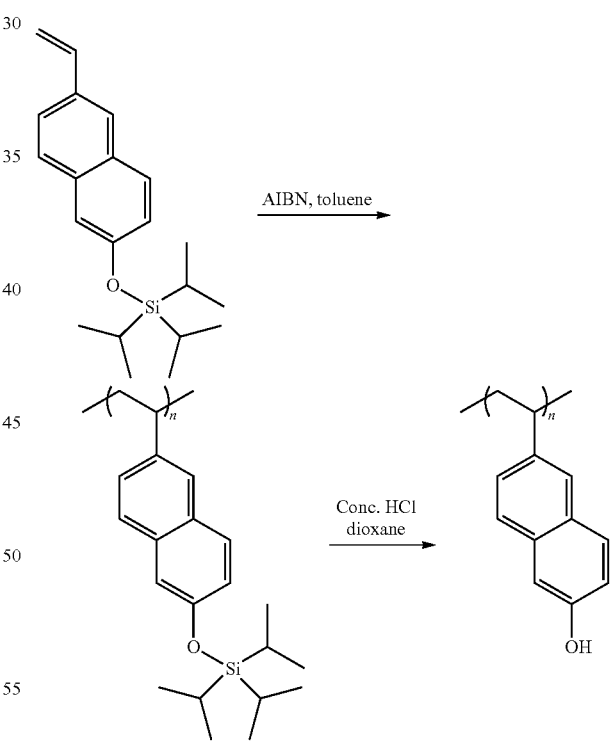

Synthesis of poly(2-hydroxy-6-vinylnaphthalene) (P2VNOH)

Figure 5:
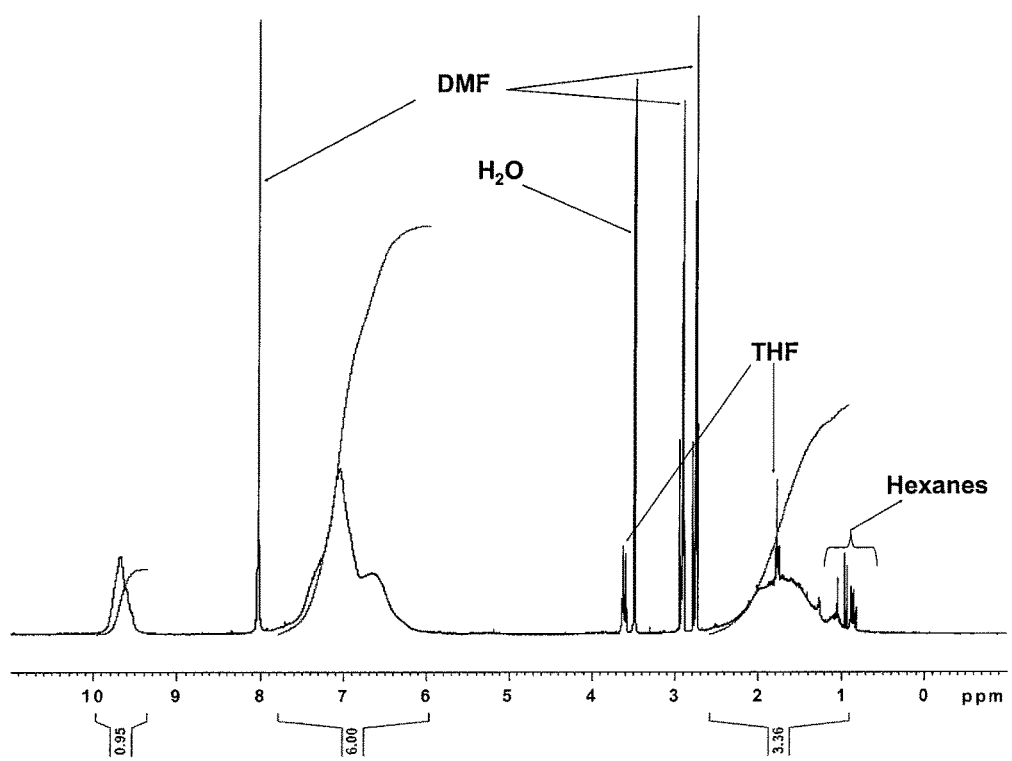
FIG. 5 provides $^1$H NMR data for Example 2 polymer (P2VNOH).

8.4 g of the P2VNOTiPS was added to a 500 mL 3 NRBF, evacuated and purged with nitrogen twice. Added 150 mL anhydrous dioxane and heated to dissolve the polymer. Purged with nitrogen for 20 min and added 11.2 mL Conc. HCl. Refluxed the solution under nitrogen for 14 h. Precipitate polymer in 1.5 L de-ionized and de-aerated water with vigorous stirring. Filtered the polymer with a nitrogen blanket over the Buchner funnel and suction dried. Dissolved polymer in 100 mL ethanol with heating and re-precipitated into 1.4 L de-ionized water with vigorous stirring and nitrogen purge. Filtered the polymer with a nitrogen blanket and dried in vacuo at 60° C. for 60 h. Dissolved the polymer in 50 mL THF, filtered through 0.45 µm followed by precipitation into 500 mL hexanes. The polymer was filtered, washed with hexanes and suction dried on the filtration funnel. The dried polymer was further dried on high vacuum at RT for 24 h. Obtained about 4.1 g (60% hydrolyzed based on $^1$H-NMR (FIG. 5) in DMSO-$d_6$).

Example 3: Preparation of Inks

To a new cleaned vial, added the planarizing polymer (poly(4-vinylphenol) or poly(2-hydroxy-6-vinylnaphthalene) and butyl cellosolve. The polymer was dissolved in the solvent by stirring on a hot-plate at 60° C.-70° C., usually about 10-15 min. Upon complete dissolution, heating was discontinued but the solution was kept stirred while it cooled to room temperature. To this the aqueous dispersion of sulfonated poly(3-[2-(2-methoxyethoxy)ethoxy]thiophene-2,5-diyl) (Plexcore MPX), was slowly added at room temp. In some instances, it was important that all the solvents and solutions/dispersions are de-aerated by purging with nitrogen for 30-60 min prior to preparing the stock solutions or inks. Example ink compositions prepared using above method is given below.

| Example | Water | 2-Butoxy-ethanol | Plexcore MPX | Poly(4-vinyl phenol) | Poly(2-hydroxy-6-vinyl naphthalene) |
|---------|--------|------------------|--------------|----------------------|-------------------------------------|
| A       | 9.555  | 5.145            | 0.045        | 0.255                | —                                   |
| B       | 13.132 | 6.468            | 0.06         | —                    | 0.34                                |
| C       | 16.415 | 8.085            | 0.075        | —                    | 0.425                               |

Example 4: Preparation and Testing of OLED Devices

The device fabrication described below is intended as an example and does not in any way imply the limitation of the invention to the said fabrication process, device architecture (sequence, number of layers etc.) or materials other than the HIL materials claimed in this invention.

The OLED devices described herein were fabricated on indium tin oxide (ITO) surfaces deposited on glass substrates. The ITO surface was pre-patterned to define the pixel area of 0.9 cm$^2$. The device substrates were cleaned by ultrasonication in a dilute soap solution followed by distilled water for 20 minutes each. This was followed by ultrasonication in isopropanol for 20 minutes. The substrates were dried under nitrogen flow, following which they were treated in a UV-Ozone chamber operating at 300 W for 20 minutes.

The cleaned substrates were then coated with the hole injection layer and dried at 170° C. for 15 minutes (60 nm dry film thickness). The coating process was done on a spin coater but can be similarly achieved with spray coating, ink-jetting, contact printing or any other deposition method capable of resulting in an HIL film of the desired thickness. An HIL ink was spin-coated and then dried at 175° C. for 15 minutes resulting in a 170 nm thick layer. This was followed by the spin coating of an interlayer (IL) and a light emitting polymer (LEP) layer which were dried at 180° C. for 60 minutes and 130° C. for 10 minutes respectively. Resulting thicknesses for the IL and LEP were 20 nm and 57 nm respectively.

The substrates were then transferred to a vacuum chamber in which, by means of physical vapor deposition, a cathode layer was deposited. In this example, the cathode layer was prepared by the sequential deposition of two metal layers, the first being a 3 nm to 5 nm layer of Ca (or Ba) (0.1 nm/sec) followed by a 200 nm layer of Al (0.5 nm/sec) with the base pressure at $5 \times 10^{-7}$ Torr.

The devices thus obtained were encapsulated with a glass cover slip to prevent exposure to ambient conditions by means of a UV-light curing epoxy resin cured at 80 W/cm$^2$ UV exposure for 4 minutes.

The OLEDs comprise pixels on a glass substrate whose electrodes extend outside the encapsulated area of the device which contain the light emitting portion of the pixels. The typical area of each pixel is 0.09 cm$^2$. The electrodes are contacted with a current source meter such as a Keithley 2400 source meter with a bias applied to the indium tin oxide electrode while the aluminum electrode is earthed. This results in positively charged carriers (holes) and negatively charged carriers being injected into the device which form excitons and generate light. In this example, the HIL assists the injection of charge carriers into the light emitting layer. This results in a low operating voltage of the device (defined as the voltage required to run a given current density through the pixel).

Simultaneously, another Keithley 2400 source meter is used to address a large area silicon photodiode. This photodiode is maintained at zero volts bias by the 2400 source meter. It is placed in direct contact with area of the glass substrate directly below the lighted area of the OLED pixel. The photodiode collects the light generated by the OLED converting them into photocurrent which is in turn read by the source meter. The photodiode current generated is quantified into optical units (candelas/sq. meter) by calibrating it with the help of a Minolta CS-200 Chromameter.

During the testing of the device, the Keithley 2400 addressing the OLED pixel applies a voltage sweep to it. The resultant current passing through the pixel is measured. At the same time the current passing through the OLED pixel results in light being generated which then results in a photocurrent reading by the other Keithley 2400 connected to the photodiode. Thus the voltage-current-light or IVL data for the pixel is generated. This in turn enables the measurement of other device characteristics such as the lumens per Watt of electrical input power to the pixel and candelas per ampere of pixel current.

The performance of different HILs in different example OLED types is described. Note that typically performance is quantified by a combination of different parameters such as operating voltage (should be low), brightness in nits (should be bright, luminous efficiency in units of cd/A (reflecting how much electric charge is needed to obtain light from the device) and the lifetime under operation (time required to reach half of the initial luminance value at the start of the test).

An improvement in lifetime can be observed when the claimed materials were used. For example, the improvement can be at least 10%, or at least 25%, or at least 50%, relative to use of a poly(vinylphenol) standard.

The lifetimes are evaluated by comparing the times at which the device brightness reached 50% of its initial value (called t50).

TABLE II

| HIL System | Emitter | Current Density (mA/cm2) | Initial Brightness (cd/m2) | Lifetime @ t50 (hrs) |
|---|---|---|---|---|
| HIL A, Device 1 (comparative) | Green (Sumation SGX002) | 62 | 8000 | 275 |
| HIL A, Device 2 (comparative) | Green (Sumation SGX002) | 62 | 8000 | 375 |
| HIL B Device 1 (inventive) | Green (Sumation SGX002) | 70 | 8000 | 400 |
| HIL B Device 2 (inventive) | Green (Sumation SGX002) | 75 | 8000 | 425 |

TABLE III

| HIL System | Emitter | Current Density (mA/cm2) | Initial Brightness (cd/m2) | Lifetime @ t50 (hrs) |
|---|---|---|---|---|
| HIL A (comparative) | Blue (Sumation SBX002) | 72 | 5000 | 40 |
| HIL C Device 1 (inventive) | Blue (Sumation SBX002) | 83 | 5000 | 50 |
| HIL C Device 2 (inventive) | Blue (Sumation SBX002) | 83 | 5000 | 50 |

Example 5: Additional Examples

Synthesis of (6-Bromo-naphthalen-2-yloxy)-triisopropyl-silane

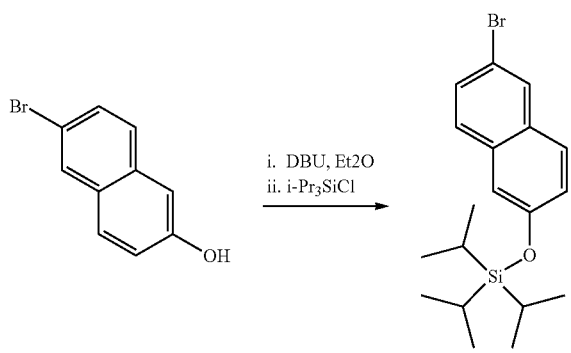 [SMILES: Oc1ccc2cc(Br)ccc2c1 ; CC(C)[Si](Oc1ccc2cc(Br)ccc2c1)(C(C)C)C(C)C]

To a 10 lit flange reactor equipped with a mechanical stirrer was added 4 lit of anhydrous diethyl ether and 503 gms of 6-bromo-2-naphthol. The reactor walls were washed with another 4 lit of diethyl ether (anhydrous) and then 378 g of 1,8-Diazabicycloundec-7-ene was added to the reactor. The contents were then stirred at room temperature (17° C.) for 30 min and triisopropylsilyl chloride (478 g) was added to the reactor dropwise over 1.5 h during which the reaction temperature went up to 30° C. The reaction was continued for 2 h and a sample removed for GC-MS. At this point, no starting material was detected in the GC-MS. The reaction mixture was worked by washing with 2×2 lit de-ionized water
2×2 lit 0.5 N sodium hydroxide
2×2 lit de-ionized water.

The ether layer was dried over anhydrous magnesium sulfate, filtered and concentrated on a rotary evaporator. The compound was finally purified by vacuum distillation using a short-path distillation set-up. Obtained 725 g of clear and colorless viscous oil (85%).

Synthesis of 6-triisopropylsilanyloxy-naphthalene-2-carbaldehyde

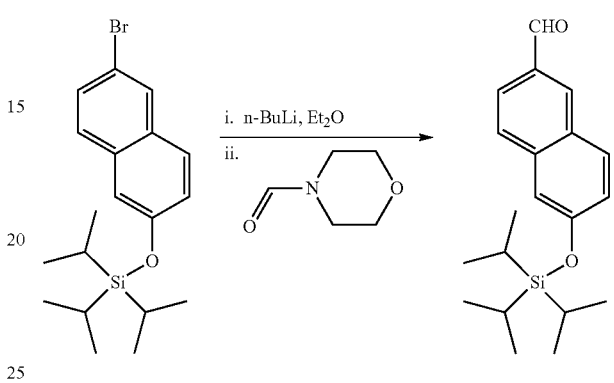

To a flame dried 2 lit 3NRBF charged 112.83 g of (6-Bromo-naphthalen-2-yloxy)-triisopropyl-silane and 1 lit diethyl ether (anhydrous) via cannular needle. The reaction mixture was then chilled to −78° C. using a dry-ice acetone bath for an hour. Then 135 mL of 2.2 M n-Butyl lithium in hexanes was added dropwise and stirred for 1 h at −78° C. The dry-ice bath was then removed and the reaction mixture allowed to attain room temperature over 1 h. A sample was removed to check for conversion and no starting material was observed on the GC-MS. At this point, 37.66 g of N-formyl morpholine was added dropwise at room temperature using a pressure equalizing dropping funnel. The funnel was washed with 25 mL anhydrous ether and the washings added to the reaction flask. The reaction was continued overnight at room temperature (about 14-15 h) and checked for conversion on the GC-MS. Since no more de-brominated sample was present, the reaction mixture was worked up with 3×500 mL dilute brine to salt out the emulsion. The combined aqueous layer was extracted with 250 mL tert-butyl methyl ether. The combined ethereal layer was dried over anhydrous magnesium sulfate, filtered and concentrated on a rotary evaporator. Finally the aldehyde was purified via vacuum distillation on a Kugelrohr set-up to obtain 74.23 g (76%) of clear yellow viscous liquid.

What is claimed is:

1. A composition comprising:
   at least one conjugated polymer, and
   at least one second polymer different from the conjugated polymer comprising at least one substituted fused aromatic hydrocarbon side group, wherein the second polymer has a number average molecular weight between 5,000 g/mol and 100,000 g/mol, wherein the fused aromatic hydrocarbon side group is substituted with an amino or thiol group,
   wherein the composition is formulated for use as a hole injection or hole transport layer in an organic device.
2. The composition of claim 1 wherein the fused aromatic hydrocarbon side group is substituted with the amino group.
3. The composition of claim 1 wherein the fused aromatic hydrocarbon side group is substituted with a thiol group.

4. The composition of claim 1, wherein the fused aromatic hydrocarbon side group is a naphthalene group.

5. The composition of claim 1, wherein the second polymer comprises a carbon backbone and the substituted fused aromatic hydrocarbon side group comprises two fused benzene rings.

6. The composition of claim 1 wherein the second polymer provides a decreased singlet and/or triplet excited state energy.

7. The composition of claim 1 wherein the second polymer is an excited state stabilizer.

8. The composition of claim 1 wherein the second polymer has a number average molecular weight between 5,100 g/mol and 34,000 g/mol.

9. The composition of claim 1, wherein the first and second polymers are at least partially soluble or dispersible in water.

10. The composition of claim 1 wherein the conjugated polymer is a heterocyclic polymer.

11. The composition of claim 1 wherein the conjugated polymer comprises a polythiophene backbone.

12. The composition according to claim 1, wherein the composition further comprises
a solvent carrier for the conjugated polymer and the second polymer.

13. A device comprising a layer comprising the composition of claim 1.

14. The device of claim 13, wherein the layer is a hole injection layer or a hole transport layer.

15. The device of claim 13, wherein the device is an OLED device.

16. A method of making a device comprising:
providing a substrate;
layering a transparent conductor on the substrate;
providing a composition comprising at least one conducting polymer comprising conjugated units, and at least one second polymer comprising fused aromatic hydrocarbon side groups, wherein the second polymer has a number average molecular weight between 5,000 g/mol and 100,000 g/mol, and wherein the fused aromatic hydrocarbon side groups are substituted with an amino or thiol group;
layering the composition on the transparent conductor to form a hole injection layer or hole transport layer;
layering an active layer on the hole injection layer or hole transport layer; and
layering a cathode on the active layer.

17. A method comprising: applying the composition of claim 1 as part of an HIL or HTL layer in an OLED, a photovoltaic device, an ESD, a SMOLED, a PLED, a sensor, a supercapacitor, a cation transducer, a drug release device, an electrochromic device, a transistor, a field effect transistor, an electrode modifier, an electrode modifier for an organic field transistor, an actuator, or a transparent electrode.

* * * * *